United States Patent
Huang et al.

(10) Patent No.: US 7,551,684 B2
(45) Date of Patent: Jun. 23, 2009

(54) WIRELESS COMMUNICATION SYSTEM USING A SINGLE TRACE FOR TRANSMITTING SIGNALS

(75) Inventors: Chen-Chia Huang, Taipei Hsien (TW); Cheng-Hsiung Hsu, Taipei Hsien (TW); Chun-Chao Chen, Taipei Hsien (TW); Kuo-Lung Lin, Taipei Hsien (TW); Pei-Chi Chen, Taipei Hsien (TW)

(73) Assignee: Wistron NeWeb Corporation, Hsi-Chih, Taipei Hsien (TW)

( * ) Notice: Subject to any disclaimer, the term of this patent is extended or adjusted under 35 U.S.C. 154(b) by 617 days.

(21) Appl. No.: 11/277,034

(22) Filed: Mar. 20, 2006

(65) Prior Publication Data
US 2007/0189413 A1   Aug. 16, 2007

(30) Foreign Application Priority Data
Feb. 15, 2006   (TW) .............................. 95105112 A

(51) Int. Cl.
   *H04L 27/00*   (2006.01)
(52) U.S. Cl. ..................................... 375/295
(58) Field of Classification Search ................. 375/295; 455/574
   See application file for complete search history.

(56) References Cited

U.S. PATENT DOCUMENTS 5,874,902 A   2/1999   Heinrich et al.
6,421,546 B1   7/2002   Tsao
6,856,787 B2 *   2/2005   Karabinis .................. 455/12.1
2004/0242182 A1   12/2004   Hidaka
2004/0257740 A1   12/2004   Block
2005/0101263 A1 *   5/2005   Kim ............................ 455/78
2005/0281094 A1 *   12/2005   Seo ....................... 365/189.09

FOREIGN PATENT DOCUMENTS

| JP | 2004-172729 A | 6/2004 |
| TW | 317067 | 10/1997 |
| TW | 327220 | 2/1998 |
| TW | 512595 | 12/2002 |

* cited by examiner

*Primary Examiner*—David C Payne
*Assistant Examiner*—Tanmay K Shah
(74) *Attorney, Agent, or Firm*—Winston Hsu

(57) ABSTRACT

A wireless communication system includes an antenna, a receiving module, a power source, and a power control hub. The power control hub includes an amplifier having a first end coupled to the receiving module and a second end coupled to the power source. The amplifier generates a first output signal based on a control signal of the receiving module. The power control hub includes a rectifier having a first end coupled to the output end of the amplifier and a second end coupled to the power source. The rectifier generates a second output signal based on the first output signal. The power control hub also includes a switch. A first and a second end of the switch are electrically connected or disconnected based on the second output signal received at a control end of the switch.

13 Claims, 5 Drawing Sheets

US 7,551,684 B2

WIRELESS COMMUNICATION SYSTEM USING A SINGLE TRACE FOR TRANSMITTING SIGNALS

BACKGROUND OF THE INVENTION

1. Field of the Invention

The present invention is related to a wireless communication system, and more particularly, to a wireless communication system using a single trace for transmitting signals, conducting DC signals and cutting off DC signals.

2. Description of the Prior Art

With the rapid development of technology, various electronic devices, such as blue-tooth devices, global positioning systems (GPSs), satellite radios or multi-media equipment, can be integrated together, providing drivers and passengers with vehicles not only capable of transportation, but also serving as mobile digital centers. In order to provide the drivers and passengers with wireless communication, a receiving module, such as a satellite radio, is disposed inside a car. An antenna is disposed outside the car for receiving signals.

Please refer to FIG. 1 for a diagram illustrating a prior art wireless communication system 10 used in a car. The wireless communication system 10 includes an active antenna 12, a receiving module 14, a power source 16, and two in-car traces. The in-car traces of the wireless communication system 10 include a power line 17 and a high-frequency signal line 18. The receiving module 14 is coupled to the power source 16 and the active antenna 12 via the power line 17 and the high-frequency signal line 18, respectively. Therefore, the receiving module 14 can receive direct current (DC) signals generated by the power source 16 via the power line 17 and high-frequency signals sent by the active antenna 12 via the high-frequency signal line 18. Also, the DC signals generated by the power source 16 are transmitted to the active antenna 12 via the power line 17 and the high-frequency signal line 18 sequentially. The receiving module 14 controls passages of the DC signals. The prior art wireless communication system 10 requires two in-car traces for signal transmission. Therefore, the trace layout is complicated and causes inconveniences for users.

Please refer to FIG. 2 for a diagram illustrating another prior art wireless communication system 20 used in a car. The wireless communication system 20 includes an active antenna 22, a receiving module 24, a power source 26, and an in-car trace. The in-car trace of the wireless communication system 20 includes a high-frequency signal line 28. The receiving module 24 is coupled to the power source 26 and the active antenna 22 via the high frequency signal line 28, and can thus receive DC signals generated by the power source 26 and high-frequency signals sent by the active antenna 22. Also, the DC signals generated by the power source 26 are directly transmitted to the active antenna 22 via the high-frequency signal line 28. The prior art wireless communication system 20 has a simpler layout by using only one in-car trace for signal transmission. However, the users cannot control power sent to the active antenna 22 using the receiving module 24. Therefore, the prior art wireless communication system 20 consumes more power.

SUMMARY OF THE INVENTION

The present invention provides a wireless communication system using a single trace for transmitting signals comprising an antenna for generating radio frequency signals, a receiving module having a signal generator for generating control signals, a power source for generating direct current signals for supplying power to the antenna and the receiving module, and a power control hub coupled to the antenna, the receiving module and the power source. The power control hub comprises an amplifier, a rectifier and a switch. The amplifier of the power control hub comprises a first end coupled to the signal generator of the receiving module for receiving the control signals generated by the signal generator, a second end coupled to the power source, and an output end for outputting first output signals generated by amplifying the control signals. The rectifier of the power control hub comprises a first end coupled to the output end of the amplifier, a second end coupled to the power source, and an output end for outputting second output signals generated by adjusting DC levels of the first output signals received from the output end of the amplifier. The switch of the power control hub comprises a first end coupled to the power source, a second end coupled to the antenna, and a control end coupled to the output end of the rectifier for electrically connecting or disconnecting the first and second ends of the switch based on the second output signals received from the output end of the rectifier.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
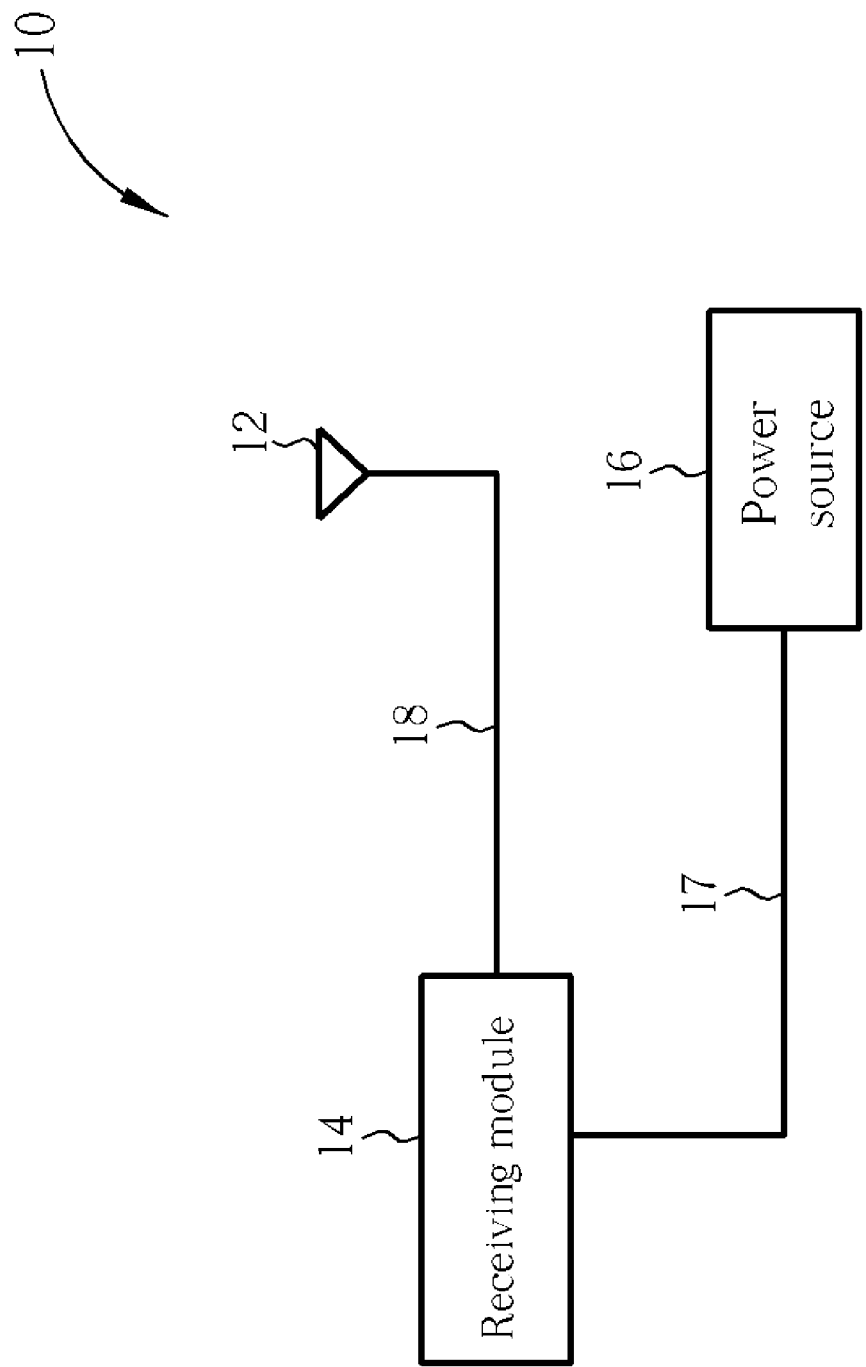
FIG. 1 is a diagram showing a prior art wireless communication system used in a car.
Figure 2:
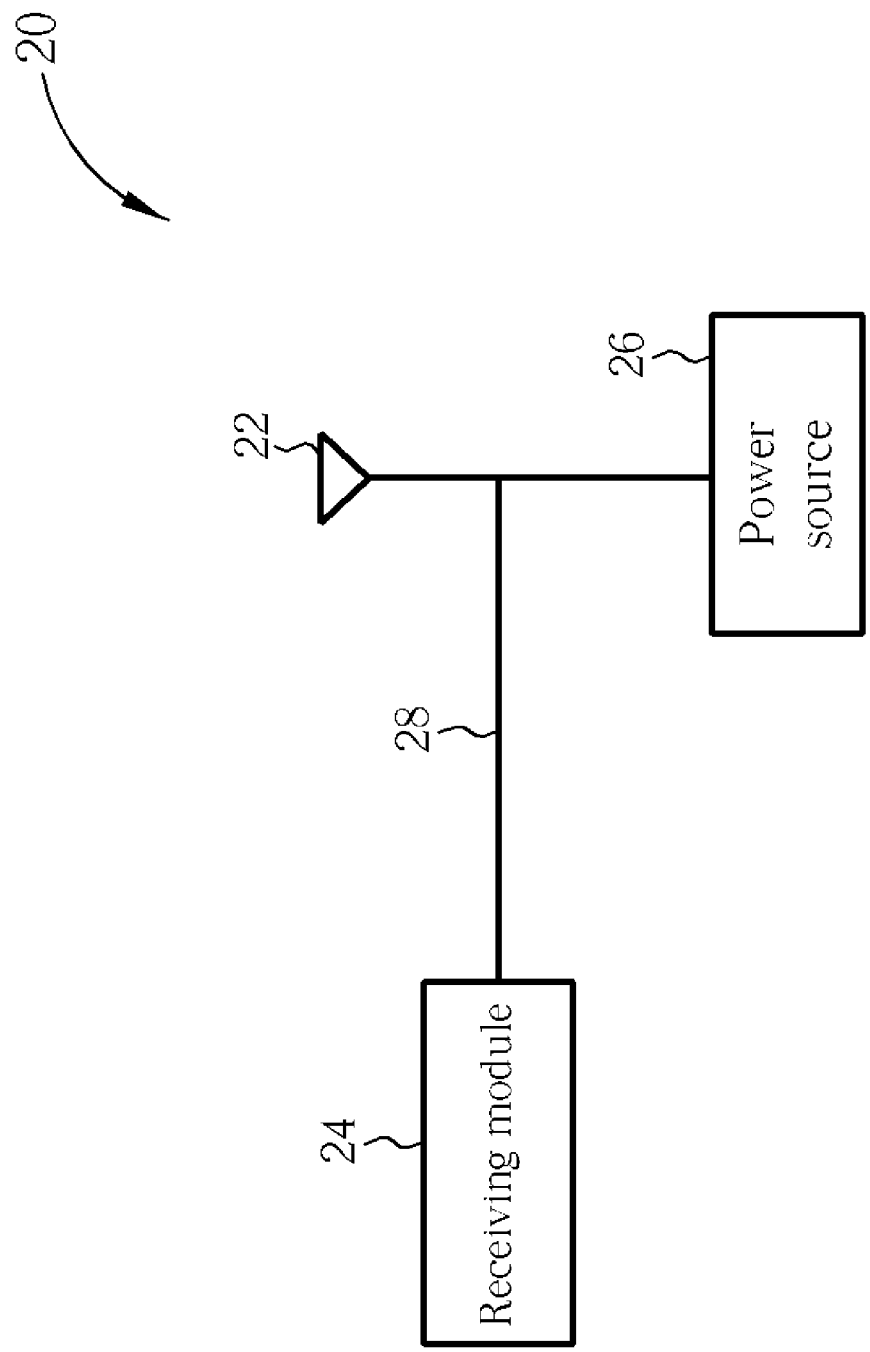
FIG. 2 is a diagram showing another prior art wireless communication system used in a car.
Figure 3:
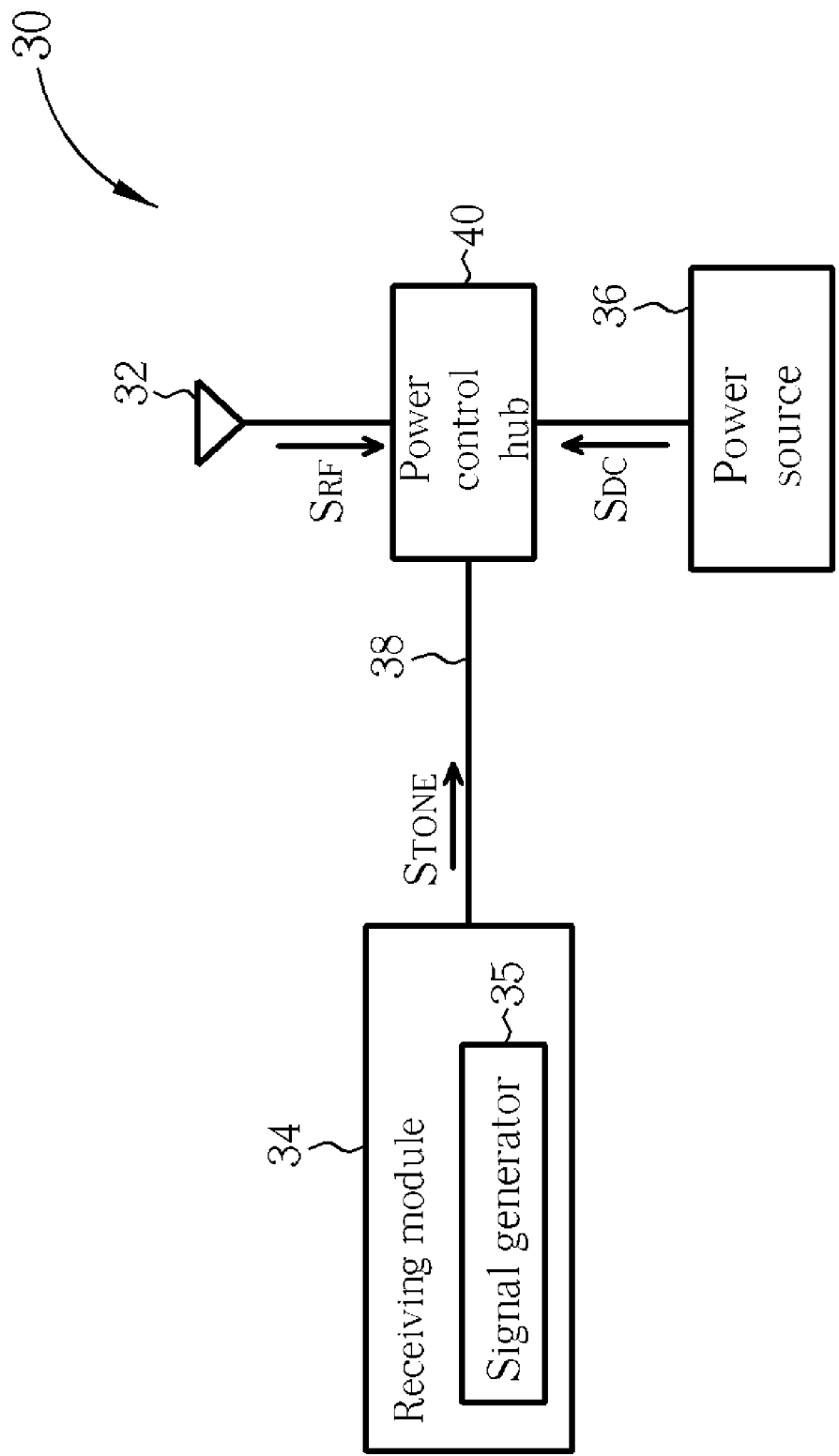
FIG. 3 is a diagram illustrating a wireless communication system according to the present invention.

Please refer to FIG. 3 for a diagram illustrating a wireless communication system 30 used in a car according to the present invention. The wireless communication system 30 includes an active antenna 32, a receiving module 34, a power source 36, a high-frequency signal line 38, and a power control hub 40. The receiving module 34 is coupled to the power source 36 and the active antenna 32 via the high-frequency signal line 38 and the control hub 40 for receiving high-frequency signals $S_{RF}$ sent by the active antenna 32 and DC signals $S_{DC}$ generated by the power source 36. Also, the active antenna 32 is coupled to the power source 36 via the power control hub 40. The receiving module 34 includes a signal generator 35 capable of generating control signals $S_{TONE}$. In the embodiment shown in FIG. 3, the control signals $S_{TONE}$ are low-frequency signals (less than 1 MHz) and can include triangular-wave or square-wave signals. When the power control hub 40 receives the control signals $S_{TONE}$, it transmits the DC power provided by the power source 36 to the active antenna 32; when the control signals $S_{TONE}$ stops, the power control hub 40 cuts off the DC power provided by the power source 36. Therefore, the wireless communication system 30 only needs one high-frequency signal line 38 for transmitting the high-frequency signals $S_{RF}$ and the DC signals $S_{DC}$. At the same time, the users can turn on or turn off the DC power supplied to the active antenna 32 via the receiving module 34. The receiving module 34 can include a satellite radio, and the power source 36 can include a cigarette lighter installed in the car.

Figure 4:
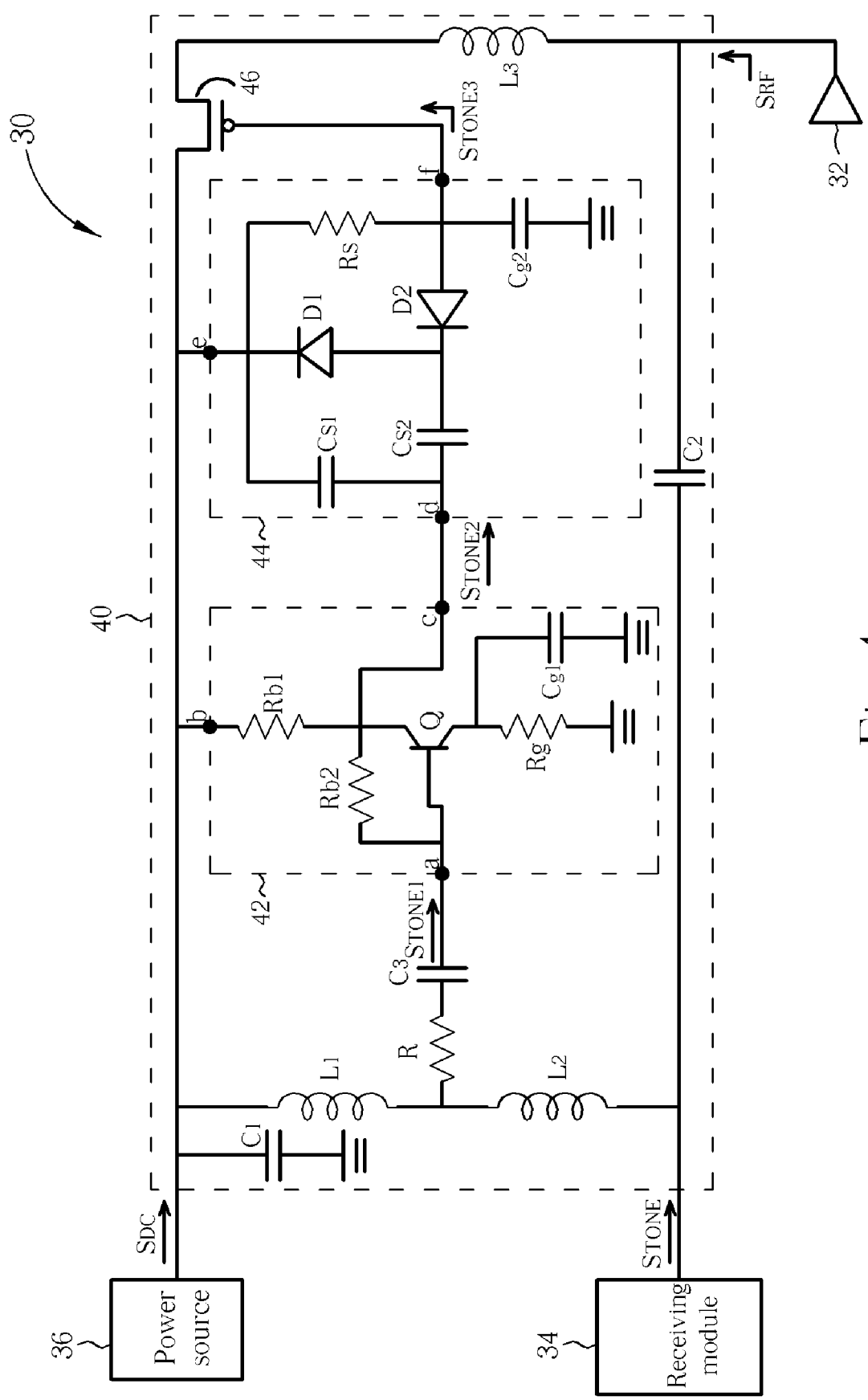
FIG. 4 is a diagram illustrating a power control hub of the wireless communication system in FIG. 3 according to a first embodiment of the present invention.

Please refer to FIG. 4 for a diagram illustrating the power control hub 40 according to a first embodiment of the present invention. The power control hub 40 includes an amplifier 42, a rectifier 44, a switch 46, capacitors C1-C3, inductors L1-L3, and a resistor R. The amplifier 42 includes a first end, a second end, and an output end, respectively designated as "a", "b", and "c" in FIG. 4. The rectifier 44 includes a first end, a second end, and an output end, respectively designated as "d", "e", and "f" in FIG. 4. The first end "a" of the amplifier 42 is coupled to the power source 36 via the capacitor C3, the resistor R and the inductor L1, and is also coupled to the receiving module 34 via the capacitor C3, the resistor R and the inductor L2. The second end "b" of the amplifier 42 is coupled to the power source 36 and the output end "c" of the amplifier 42 is coupled to the first end "d" of the rectifier 44. The second end "e" of the rectifier 44 is coupled to the power source 36 and the output end "f" of the rectifier 44 is coupled to the control end of the switch 46. The switch 46, having a first end coupled to the power source 36 and a second end coupled to the active antenna 32 via the inductor L3, can electrically connect or isolate the power source 36 and the active antenna 32 based on signals received at the control end of the switch 46.

The operations of the capacitors C1-C3, the inductors L1-L3 and the resistor R will be described. The power control hub 40 of the present invention needs to handle the high-frequency signals $S_{RF}$ sent by the active antenna 32, the control signals $S_{TONE}$ generated by the receiving module 34, and the DC signals $S_{DC}$ generated by the power source 36. The inductor L1, having the largest inductance among the three inductors, can provide passages for the DC signals $S_{DC}$ and block the control signals $S_{TONE}$. By adjusting the inductance of the inductor L1, the inductor L1 can block the control signals $S_{TONE}$ having different frequencies and thus reduce signal losses of the control signals $S_{TONE}$. The inductor L2 can provide passages for the DC signals $S_{DC}$ and the control signals $S_{TONE}$, while blocking the high-frequency signals $S_{RF}$. The inductor L3 can provide passages for the DC signals $S_{DC}$, while blocking the high-frequency signals $S_{RF}$. The capacitor C2 can provide passages for the high-frequency signals $S_{RF}$, while blocking the DC signals $S_{DC}$ and the control signals $S_{TONE}$. The capacitor C3 can block the DC signals $S_{DC}$ and can adjust the voltage levels of the control signals $S_{TONE}$ by low-pass filtering the control signals $S_{TONE}$ together with the resistor R.

The amplifier 42 includes a transistor Q, bias resistors Rb1-Rb2, a ground resistor Rg, and a ground capacitor Cg1. The transistor Q can include a bipolar junction transistor (BJT), a metal-oxide-semiconductor field effect transistor (MOSFET), or other devices. In the embodiments shown in FIG. 4, the transistor Q is an n-p-n type BJT having a base coupled to the first end "a" of the power control hub 40, a collector coupled to the second end "b" of the power control hub 40 via the bias resistor Rb1 and to the output end "c" of the power control hub 40, and an emitter coupled to ground via the ground resistor Rg. The bias resistor Rb2 is coupled between the collector and the base of the transistor Q, and the ground capacitor Cg1 is coupled between the emitter of the transistor Q and ground. The bias resistors Rb1 and Rb2 can provide the transistor Q with appropriate bias voltages. The ground resistor Rg can provide the transistor Q with a negative feedback for compensating undesired outside influences due to temperature or input voltage variations. Since the first end "a" of the amplifier 42 is coupled to the power source 36 via the capacitor C3, the resistor R and the inductor L1, the capacitor C3 blocks the DC signals $S_{DC}$ generated by the power source 36, and only the control signals $S_{TONE}$ pass through the resistor R and the capacitor C3. After low-pass filtering the control signals $S_{TONE}$ by the resistor R and the capacitor C3, control signals $S_{TONE1}$ are generated and sent to the first end "a" of the amplifier 42. The transistor Q generates corresponding control signals $S_{TONE2}$ by amplifying the control signals $S_{TONE1}$, and outputs the control signals $S_{TONE2}$ to the first end "d" of the rectifier 44.

The rectifier 44 includes a resistor Rs, diodes D1 and D2, charging capacitors Cs1 and Cs2, and a ground capacitor Cg2. The rectifier 44 has the first end "d" coupled to the output end "c" of the transistor Q, the second end "e" coupled to the power source 36, and the output end "f" coupled to the control end of the switch 46. The charging capacitor Cs2 and the diode D2 are coupled in series between the first end "d" and the output end "f" of the rectifier 44. The charging capacitor Cs1 is coupled between the first end "d" and the second end "e" of the rectifier 44. The resistor Rs is coupled between the output end "f" and the second end "e" of the rectifier 44. The anode of the diode D1 is coupled between the charging capacitor Cs2 and the cathode of the diode D2. The cathode of the diode D1 is coupled to the second end "e" of the rectifier 44. The ground capacitor Cg2 is coupled between the output end "f" of the rectifier 44 and ground. The charging capacitors Cs1, Cs2 and the diodes D1, D2 can control the DC levels of the control signals $S_{TONE2}$ by charging and discharging the control signals $S_{TONE2}$ in the positive/negative halves of a period. If the transistor Q can provide a sufficient gain or the voltage levels of the control signals $S_{TONE2}$ are large enough, the present invention can use only one charging capacitor for charging and discharging the control signals $S_{TONE2}$. The resistance of the resistor Rs can be determined based on the voltage levels of the control signals $S_{TONE2}$. By changing the resistance of the resistor Rs, the threshold voltage with which the switch 46 is turned on/off can thus be adjusted. The ground capacitor Cg2 can delay the turn-on and turn-off of the switch 46, so that outside noises will not be mistaken as the control signal $S_{TONE2}$ and the switch 46 can avoid erroneous operations. The rectifier 44 generates corresponding control signals $S_{TONE3}$ by adjusting the DC levels of the control signals $S_{TONE2}$, and outputs the control signals $S_{TONE3}$ to the control end of the switch 46.

The switch 46 can include a P-type MOSFET with an initial state "off"(open-circuited). Therefore, the DC signals $S_{DC}$ generated by the power source 36 cannot be transmitted to the active antenna 32 via the switch 46. Also, the capacitor C2 prevents the DC signals $S_{DC}$ that have passed through the inductors L1 and L2 from reaching the active antenna 32. When a user generates the control signals $S_{TONE}$ using the receiving module 34, the control signals $S_{TONE}$ is sent to the amplifier 42 and the rectifier 44 via the inductor L2, the resistor R and the capacitor C3 sequentially. The control signals $S_{TONE3}$, generated by amplifying the control signals $S_{TONE}$ using the amplifier 42 and the rectifier 44, turns on the switch 46 for providing passages between the power source 36 and the active antenna 32. Therefore, the DC signals $S_{DC}$ generated by the power source 36 can be transmitted to the active antenna 32 via the turned-on switch 46.

Figure 5:
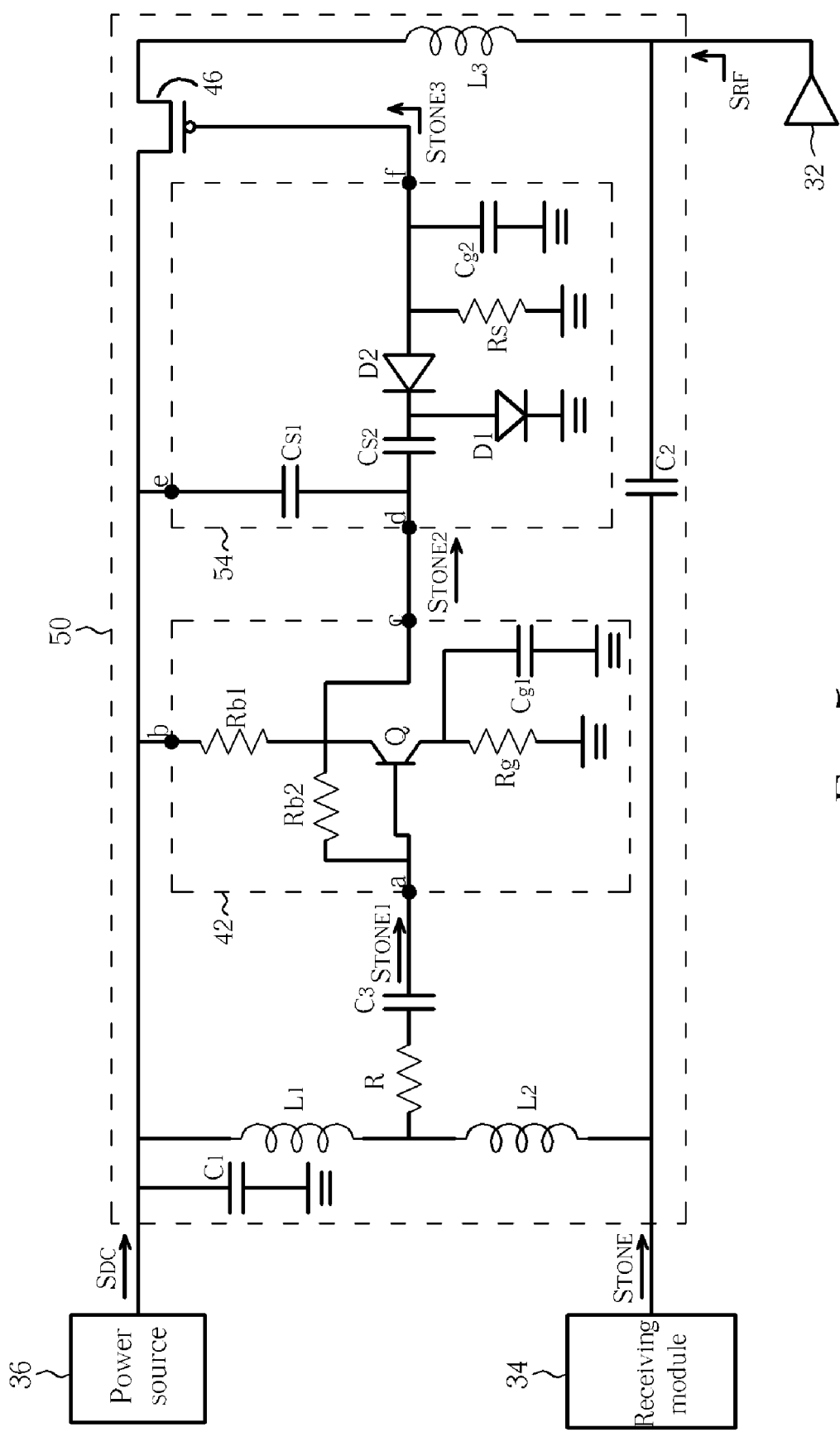
FIG. 5 is a diagram illustrating a power control hub of the wireless communication system in FIG. 3 according to a second embodiment of the present invention.

Please refer to FIG. 5 for a diagram illustrating a power control hub 50 according to a second embodiment of the present invention. The power control hub 50 includes an amplifier 42, a rectifier 54, a switch 46, capacitors C1-C3, inductors L1-L3, and a resistor R. The amplifier 42 includes a first end, a second end, and an output end, respectively designated as "a", "b", and "c" in FIG. 5. The rectifier 54 includes a first end, a second end, and an output end, respectively designated as "d", "e", and "f" in FIG. 5. The first end "a" of the amplifier 42 is coupled to the power source 36 via the capacitor C3, the resistor R and the inductor L1, and is also coupled to the receiving module 34 via the capacitor C3, the resistor R and the inductor L2. The second end "b" of the amplifier 42 is coupled to the power source 36 and the output end "c" of the amplifier 42 is coupled to the first end "d" of the rectifier 54. The second end "e" of the rectifier 54 is coupled to the power source 36 and the output end "f" of the rectifier 54 is coupled to the control end of the switch 46. The switch 46, having a first end coupled to the power source 36 and a second end coupled to the active antenna 32 via the inductor L3, can electrically connect or isolate the power source 36 and the active antenna 32 based on signals received at the control end of the switch 46.

The power control hub 50 differs from the power control hub 40 in that the rectifier 54 of the power control hub 50 is different from the rectifier 44 of the power control hub 40. The rectifier 54 also includes a resistor Rs, diodes D1 and D2, charging capacitors Cs1 and Cs2, and a ground capacitor Cg2. However, the charging capacitor Cs2 and the diode D2 are coupled in series between the first end "d" and the output end "f" of the rectifier 54. The charging capacitor Cs1 is coupled between the first end "d" and the second end "e" of the rectifier 54. The anode of the diode D1 is coupled between the charging capacitor Cs2 and the diode D2. The cathode of the diode D1 is coupled to ground. The charging capacitors Cs1, Cs2 and the diodes D1, D2 can control the DC levels of the control signals $S_{TONE2}$ by charging and discharging the control signals $S_{TONE2}$ in the positive/negative halves of a period. If the transistor Q can provide a sufficient gain or the voltage levels of the control signals $S_{TONE2}$ are large enough, the present invention can use only one charging capacitor for charging and discharging the control signals $S_{TONE2}$. The resistance of the resistor Rs can also be determined based on the voltage levels of the control signals $S_{TONE2}$. By changing the resistance of the resistor Rs, the threshold voltage with which the switch 46 is turned on/off can thus be adjusted. The ground capacitor Cg2 can delay the turn-on and turn-off of the switch 46, SO that outside noises will not be mistaken as the control signal $S_{TONE2}$ and the switch 46 can avoid erroneous operations. The rectifier 54 generates corresponding control signals $S_{TONE3}$ by adjusting the DC levels of the control signals $S_{TONE2}$, and outputs the control signals $S_{TONE3}$ to the control end of the switch 46.

Since the rectifiers 44 and 54 are used to adjust the DC levels of the voltages outputted to the control end of the switch 46, the present invention can use the rectifier 44 or 54 based on the characteristics of the switch 46. For example, if the switch 46 is a p-type MOSFET with a high threshold voltage, the rectifier 44 can be adopted in the wireless communication system 30 of the present invention; if the switch 46 is a p-type MOSFET with a low threshold voltage, the rectifier 54 can be adopted in the wireless communication system 30 of the present invention.

In the wireless communication system of the present invention, only one high-frequency signal line is required for transmitting high-frequency signals and DC signals. Therefore, the trace layout can be simplified. By giving commands to the power control hub using the receiving module, the users can also turn on or turn off the DC power supplied to the active antenna flexibly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A wireless communication system using a single trace for transmitting signals comprising:
   an antenna for generating radio frequency (RF) signals;
   a receiving module having a signal generator for generating control signals;
   a power source for generating direct current (DC) signals for supplying power to the antenna and the receiving module; and
   a power control hub coupled to the antenna, the receiving module and the power source, the power control hub comprising:
      an amplifier comprising:
         a first end coupled to the signal generator of the receiving module for receiving the control signals generated by the signal generator;
         a second end coupled to the power source; and
         an output end for outputting first output signals generated by amplifying the control signals;
      a rectifier comprising:
         a first end coupled to the output end of the amplifier;
         a second end coupled to the power source; and
         an output end for outputting second output signals generated by adjusting DC levels of the first output signals received from the output end of the amplifier; and
      a switch comprising:
         a first end coupled to the power source;
         a second end coupled to the antenna; and
         a control end coupled to the output end of the rectifier for electrically connecting or disconnecting the first and second ends of the switch based on the second output signals received from the output end of the rectifier.

2. The wireless communication system of claim 1 further comprising:
   a first inductor coupled between the power source and the first end of the amplifier for providing passages for the DC signals generated by the power source;
   a second inductor coupled between the first end of the amplifier and the receiving module for providing passages for the DC signals generated by the power source and the control signals generated by the signal generator, and for blocking the RF signals sent by the antenna;
   a third inductor coupled between the second end of the switch and the antenna for providing passages for the DC signals generated by the power source and for blocking the RF signals sent by the antenna;
   a first capacitor coupled between the power source and ground for blocking the control signals generated by the signal generator; and
   a second capacitor coupled between the receiving module and the antenna for providing passages for the RF signals sent by the antenna, and for blocking the DC signals generated by the power source and the control signals generated by the signal generator.

3. The wireless communication system of claim 2 further comprising:
   a first resistor having a first end coupled between the first and second inductors for adjusting voltage levels of the control signals; and a third capacitor coupled between a second end of the first resistor and the first end of the amplifier for blocking the DC signals generated by the power source.

4. The wireless communication system of claim 1 wherein the amplifier comprises:
   a transistor having a control end coupled to the first end of the amplifier;
   a first bias resistor coupled between the power source and a first end of the transistor;
   a second bias resistor coupled between the control end and the first end of the transistor;
   a ground resistor coupled between a second end of the transistor and ground; and
   a gain capacitor coupled between the second end of the transistor and ground and in parallel with the ground resistor for increasing the amount of gain provided by the transistor when amplifying the control signals.

5. The wireless communication system of claim 4 wherein the transistor includes a bipolar junction transistor (BJT) or a metal-oxide-semiconductor field effect transistor (MOSFET).

6. The wireless communication system of claim 1 wherein the rectifier comprises:
   a first charging capacitor coupled between the first and second ends of the rectifier;
   a resistor coupled between the second and output ends of the rectifier;
   a first diode having an anode coupled to the first end of the rectifier and a cathode coupled to the second end of the rectifier;
   a second diode having an anode coupled to the output end of the rectifier and a cathode coupled to the anode of the first diode; and
   a ground capacitor coupled between the output end of the rectifier and ground.

7. The wireless communication system of claim 6 wherein the rectifier further comprises:
   a second charging capacitor coupled between the first end of the rectifier and the cathode of the second diode.

8. The wireless communication system of claim 1 wherein the rectifier comprises:
   a resistor coupled between the second and output ends of the rectifier;
   a first diode having a cathode coupled to the second end of the rectifier;
   a second diode having an anode coupled to the output end of the rectifier and a cathode coupled to the anode of the first diode;
   a charging capacitor coupled between the first end of the rectifier and the cathode of the second diode; and
   a ground capacitor coupled between the output end of the rectifier and ground.

9. The wireless communication system of claim 1 wherein the rectifier comprises:
   a resistor coupled between the output end of the rectifier and ground;
   a ground capacitor coupled between the output end of the rectifier and ground;
   a first diode having an anode coupled to the first end of the rectifier and a cathode coupled to ground;
   a second diode having an anode coupled to the output end of the rectifier and a cathode coupled to the anode of the first diode; and
   a first charging capacitor coupled between the first end of the rectifier and the cathode of the second diode.

10. The wireless communication system of claim 9 wherein the rectifier further comprises:
    a second charging capacitor coupled between the first and second ends of the rectifier.

11. The wireless communication system of claim 1 wherein the rectifier comprises:
    a resistor coupled between the output end of the rectifier and ground;
    a ground capacitor coupled between the output end of the rectifier and ground;
    a first diode having an anode coupled to the first end of the rectifier and a cathode coupled to ground;
    a second diode having an anode coupled to the output end of the rectifier and a cathode coupled to the anode of the first diode; and
    a charging capacitor coupled between the first and second ends of the rectifier.

12. The wireless communication system of claim 1 wherein the switch includes a MOSFET.

13. The wireless communication system of claim 1 wherein the receiving module includes a satellite radio.

* * * * *